Aug. 9, 1955 TOMOMI MURAKAMI 2,715,211

ULTRA HIGH FREQUENCY TUNING SYSTEMS

Filed Feb. 2, 1950

INVENTOR
TOMOMI MURAKAMI

BY H. D. Newton
Attorney 2,715,211
Patented Aug. 9, 1955

1

2,715,211

ULTRA HIGH FREQUENCY TUNING SYSTEMS

Tomomi Murakami, Philadelphia, Pa., assignor to Radio Corporation of America, a corporation of Delaware Application February 2, 1950, Serial No. 142,012

4 Claims. (Cl. 333—82)

This invention relates generally to ultra high frequency tuning systems and particularly to resonant circuits or structures utilizing tapered electrical lines tunable over an ultra high frequency range by means of a movable tuning element or core.

Allocation of frequencies from 500 to 1,000 megacycles to various commercial broadcasting services has enabled the transmission of modulated carrier waves as well as black and white and color television signals within this ultra high frequency range. It is, therefore, extremely important for the reception of modulated carrier waves that resonant circuits or structures be provided which are operable within and efficiently tunable over a fairly wide portion of this ultra high frequency spectrum.

Resonant circuits are readily obtained with conventional capacitors and coils up to about 100 or 200 megacycles, with tuning being accomplished by varying one or both of these elements. Satisfactory operation, however, is difficult to obtain at higher frequencies, as for any given capacitor there is an upper frequency limit beyond which its inherent residual inductance and capacitance becomes a major portion of the total circuit inductance and capacitance.

At low frequencies the ohmic loss in the conductive structure of the capacitor is usually negligible compared to dielectric losses and to the ohmic losses in the coil. However, as the frequency is raised the tuned circuit losses of the capacitor become more important in determining the circuit Q.

Contact resistance, when sliding contacts are used to vary the frequency, is another problem of high frequency apparatus. The contact noise is generated when the resistance between the sliding members varies erratically as different portions of the metallic surfaces come in contact with each other.

Resonant circuits have been tuned by ferromagnetic cores movable relative to the coil of a tuned circuit, thereby varying the permeability of the core area and the inductance of the circuit. However, permeability tuning is not completely satisfactory at frequencies of the order of 500 megacycles or more, and it has been found that operation above 650 megacycles is difficult to obtain by this means.

It is furthermore known that the frequency of a resonant circuit may be adjusted by eddy current tuning in which the inductance of the resonant circuit is altered by moving a non-magnetic core of high conductivity with respect to a coil, but when used with conventional circuits the upper frequency limit attainable is less than that required for operation in the ultra high frequency range. Accordingly, none of these methods are completely suitable for tuning a resonant circuit within the ultra high frequency range substantially above 500 megacycles.

It is therefore an object of this invention, to provide an improved, simple, inexpensive and stable ultra high frequency tunable resonant structure for use at any high frequency and which is easily adaptable to circuits in which unitary control is desirable and in which tracking can be readily effected.

2

It is a further object of this invention, to provide an improved variably tunable resonant structure operable in the ultra high frequency ranges referred to, and without the use of moving contacts.

It is an additional object of this invention, to provide an improved resonant structure tunable over a relatively broad band of ultra high frequencies, which can be efficiently matched to other circuit components at ultra high frequencies.

In accordance with the present invention, there is provided a pair of spaced conductive members having distributed inductance and capacitance. Each of these spaced conductive members is tapered, thereby providing a varying capacitance and inductance along the length of the members. There is further provided a tuning element, such as a core or body of material having conductive or dielectric properties or both in predetermined degree, movable along and in proximity to the tapered members but insulated therefrom.

A further understanding of the invention may be had by reference to the following description when read in connection with the accompanying drawing, in which like reference numerals are used for like parts throughout the various figures, and in which.

Figures 1, 2, 3, 4, 5, 6, 7, 8, 9, 10:
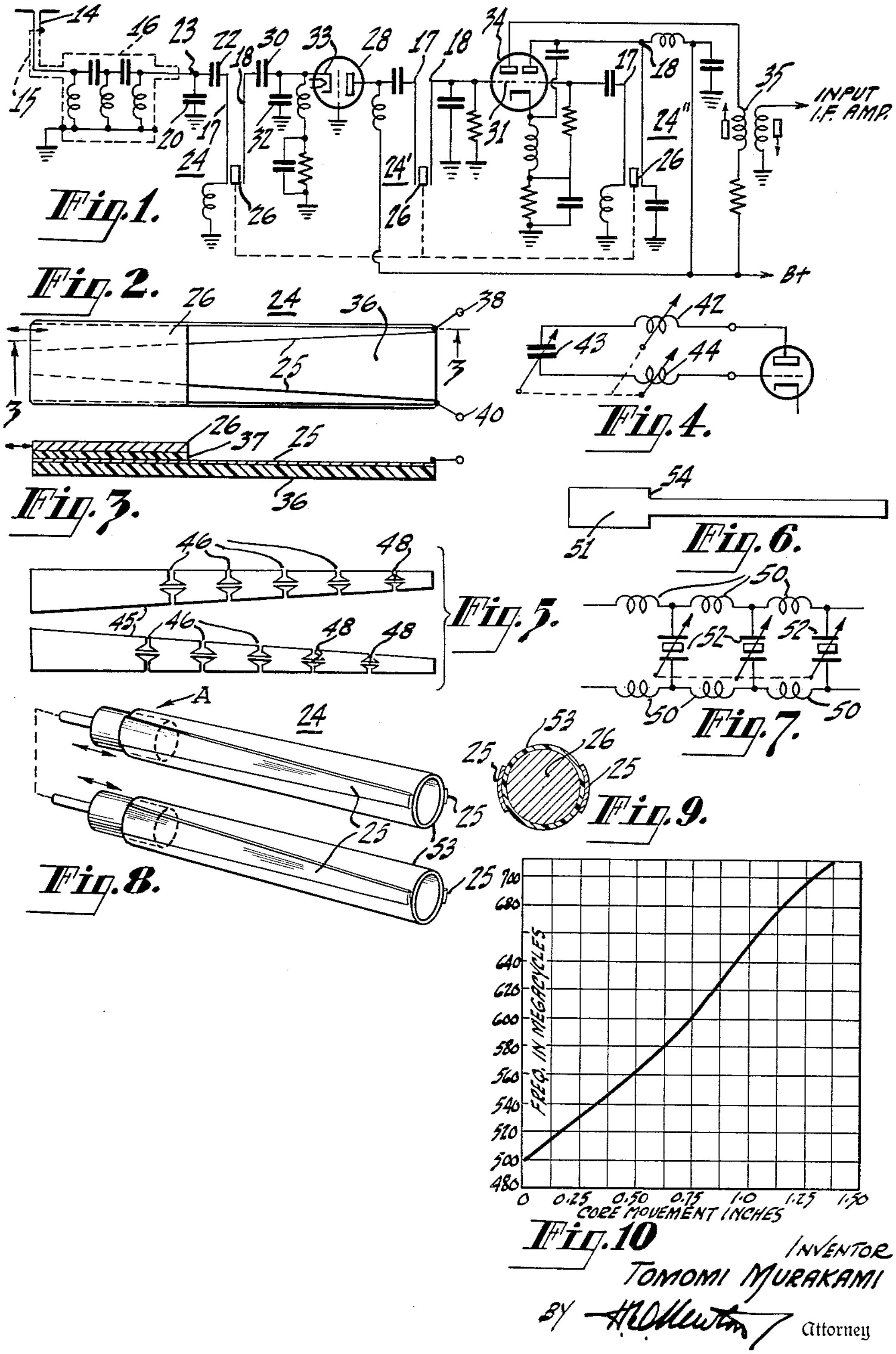
Figure 1 is a schematic circuit diagram of a portion of an ultra high frequency receiver having tunable circuits constructed in accordance with the present invention.
Figure 2 is a top plan view of a resonant structure illustrating one embodiment of the invention.
Figure 3 is an elevational view of the structure of Figure 2 taken through line 3—3 looking in the direction of the arrows.
Figure 4 is a schematic circuit diagram of the equivalent electrical circuit of the structure shown in Figure 2.
Figure 5 is a plan view of certain tapered tuning members of the structure of Figure 2, modified in accordance with the invention.
Figure 6 is a top plan view of a tapered tuning member which represents a further detail modification of the invention and may provide a substitute for the corresponding members of Figures 2 and 4 in certain tuning systems.
Figure 7 is a schematic circuit diagram of the equivalent electrical circuit of a resonant tuning structure modified in accordance with Figure 5, in accordance with the invention.
Figure 8 is a perspective view of resonant structures constructed in accordance with a further embodiment of the invention and illustrating their use as an ultra high frequency transformer.
Figure 9 is a cross-sectional view of one of the resonant structures of Figure 8, taken at A.
Figure 10 is a graph showing a curve representing the relation between frequency response and core movement in a tunable resonant structure embodying the invention.

Referring to Figure 1, there is shown a portion of an ultra high frequency signal receiving system which is one form of apparatus for which the invention is particularly adapted. This apparatus comprises a signal input means, which by way of example is illustrated as a dipole 14, for receiving modulated carrier wave energy. The received energy is conveyed from the dipole through a coaxial cable 15 to a high pass filter designated by the dotted block 16.

This filter, shown schematically, reduces spurious responses most of which are of frequencies below 500 megacycles, and can be provided in various ways as is well known in the art, but a printed circuit is preferred and presently used. Printing of a circuit such as this is accomplished by photoengraving a copper sheet bonded to a paper base Bakelite sheet. A high pass filter is used, since it is less critical to variations in photoengraving than the band pass type and can be easily designed to operate with a 75 ohm coaxial transmission line.

One member 17 of a tuned resonant structure 24, as provided by the invention, and which will be discussed in detail in connection with the remaining figures, is capacity coupled by means of capacitors 20 and 22 to the output terminal 23 of the filter 16. These capacitors 20 and 22 provide proper impedance matching between the filter and the tuned circuit. As indicated in the drawing, this resonant structure is tunable to the desired frequency by means of a movable tuning element or "core" 26, which may be a body of conductive material such as copper or brass, and which may be mechanically coupled with the cores of other resonant structures in the receiver to enable unicontrol tuning. The other member 18 of the resonant structure 24 is coupled by capacitors 30 and 32 to the cathode 33 of a grounded-grid triode, electron tube 28, used as a radio frequency amplifier stage. Coupling between the tuned resonant structure and the input circuit of the radio frequency amplifier by means of capacitors 30 and 32, enables proper impedance matching, as at these high frequencies the input impedance of the electron tube 28 is in the order of 80 ohms.

In a similar manner there is coupled to the anode circuit of the electron tube 28, a second tuned resonant structure 24' with its associated tuning member or core 26, and which is identical to the first tuned resonant structure 24. This resonant structure provides selective coupling between the radio frequency amplifier stage and the grid 31 of a double triode electron tube 34 utilized as an oscillator-mixer stage. A third tuned resonant structure 24'' which may be of the same type as the first two tuned resonant structures, but differing in frequency response by an amount equal to the desired intermediate frequency of the system, is provided to tune the oscillator section of the double triode electron tube 34. This resonant structure 24'', coupled with the oscillator portion of the discharge tube 34, operates as a modified Colpitts oscillator which is cathode-coupled to the mixer portion of the electron tube 34. The output of the mixer stage is derived from an impedance 35 which may be the primary winding of an intermediate frequency transformer providing coupling to an intermediate frequency amplifier stage of the receiving system.

One form of the invention is illustrated in Figures 2 and 3, in which two tapered members 25 of conductive material such as copper foil are mounted on a supporting strip 36 of suitable insulating material such as paper base Bakelite. Slidably mounted above these two tapered members 25 is a flat conductive metal tuning element 26 which is separated from the tapered members 25 by a layer or coating 37 of insulating material such as Bakelite, or merely an air gap. Terminals 38 and 40 connected to the smaller ends of tapered members 25 can be inserted between the capacitors 22 and 30 in the circuit of Figure 1 to provide the required resonant structure therefor.

A capacitance exists between the tuning element 26 and the tapered members 25; the magnitude of this capacitance is directly dependent upon the effective area of the capacitor plates and upon the dielectric constant of the material between the capacitor plates and inversely proportional to the distance between the plates. It will be noted that the width of the flat plate constituting the tuning element is at least as wide as the overall width of the members 25. As the tuning element 26 is moved along the tapered members 25, the plate area of the effective capacitor is varied due to the taper of the members 25, thereby varying the amount of capacitance exhibited by the resonant structure. It is evident that each tapered member has inductance which is distributed along its length. It is further evident that the distributed inductance per unit of length of the tapered members is nonuniform due to the varying conductive area provided by the tapered member. Tuning of the resonant structure is primarily due to the change in inductance as the effective capacitive reactance between the tapered members is moved along the members thereby utilizing a lesser or greater portion of the length of the members. The tapered shape of the members is such as to provide the proper change of capacitance and inductance in the circuit to produce a substantially linear frequency curve in relation to tuning element movement. It is noted that as the tuning element is moved along the tapered members toward the smaller ends of the members, the inductance and the capacitance of the resonant structure are decreased, causing the resonant frequency of the resonant structure to increase.

Referring to Figure 4, which is a schematic circuit diagram of the equivalent electrical circuit of the apparatus of Figure 3, the distributed inductance of the tapered members 25 is represented schematically by the two variable inductances 42 and 44, which are connected through a capacitor 43, representative of the capacitance provided by the tuning element 26.

As the tuning element 26 is moved along the members 25, the portion of the members along which the capacitor formed by the tapered members and the tuning element appears, determines the amount of usable inductance remaining in the circuit. Also, as discussed in the foregoing, these members have inherent capacity to one another; the amount of capacitance in the circuit is varied by changing, due to the taper, the amount of area in proximity with the tuning element. These members are so designed that upon movement of the tuning element the inductance to capacitance ratio of the circuit remains substantially constant.

The operational characteristics obtained by using the tapered members 45 of Figure 5, having therein cut-out portions indicated at 46, are substantially identical to the characteristics of the embodiment of Figure 2. An advantage provided by these cut-out sections is an extended tuning range established due to the increased inductance of the thin connecting or conductor portions 48, at the centers of the cut-out sections 46, being effectively of reduced cross-section or width.

The schematic circuit diagram of the equivalent electric circuit as shown in Figure 7, is representative of the electrical characteristics of the tapered members of Figure 5. The lumped variable inductances 50 schematically represent the inductance provided by the narrow connecting portions 48. This is an essentially accurate picture if it is remembered that the inductance provided by each of these narrow connecting portions 48 is extremely small even in the ultra high frequency range. Since the uncut portions of the tapered elements 45 provide large areas relative to the area of the thin connecting links 48, these are schematically represented as variable capacitors 52. It is to be understood that there is also a variable inductance associated with the uncut portion of the members, though somewhat smaller than the inductance provided by the narrow connecting portions.

Figure 6 illustrates another form 51 of the tapered members, in which the taper is increased to provide a radical change in width at one point 54 along its length. This shape produces a tuning characteristic similar to the before-mentioned modifications. Frequency change per unit of tuning element movement is maintained in a smooth curve, due to the capacitive proximity effect of the core or flat tuning member as it approaches and leaves the point at which the width of the member is radically reduced.

The operation of the above modification is as follows: The capacitance between the tapered members by the tuning element is not such as provided by physical contact, but exists due to capacitance between an infinitely large number of elemental areas on the tapered members and on the tuning element. An elemental area of the tuning element is moved away from or toward an elemental area of the tapered member as the tuning element is moved axially along the tapered members. A summation of the capacitance of all the elemental capacitors gives the effective capacitance which exists for any given position of the tuning element along the tapered members. It is readily seen that, as the tuning element is moved away from or toward the point at which the change in width of the tapered member occurs, the change in the total number of elemental areas involved does not follow a radical change, but instead is represented by a smooth curve, thereby providing a tuning curve substantially identical to that provided by the embodiments as illustrated in Figures 2 and 5.

A pair of resonant structures constructed in accordance with a preferred embodiment of the invention is shown in Figures 8 and 9, wherein the relative positioning of the resonant structures specifically illustrates their use as an ultra high frequency transformer. In each resonant structure, the tapered members 25 are affixed to the outer surface of an insulating tubular support 53. The core 26 is slidably disposed within the tubular support 53 to provide tuning of the structure. When the core is moved in the tube, both the effective length of the members and the capacitive reactance terminating the members is varied. The tuning range of a particular unit can be changed by varying the maximum amount of the capacitive and inductive reactance of the structure. This can most readily be done by changing the diameter of the thin walled tubing as the size of the tapered members is changed. In general, increasing the diameter of the tube causes an increase in the tuning range. As the length of the tapered members is increased, the frequency at which the open end of the members is effectively a quarter wavelength may fall within the pass band. This may or may not cause the impedance of the structure to fall below a usable value, depending upon the core position when this critical frequency is reached. However, the length of the structure will determine the highest frequency which can be obtained with the core in the extreme position, due to the effect of capacitive loading by the overhanging or unused extending ends of the tapered members. In any case, it will be noted that the movable tuning member travels within the length of the conductive members, from end to end, and is relatively short with respect to the length of the resonant structure.

A second circuit is disposed in proximity to the first resonant structure, having its tapered members 25 in parallel relation to the tapered members of the first resonant structure. In this manner coupling will be provided between adjacent members thereby allowing transfer of energy from one resonant structure to the other. If it is necessary to have two resonant structures operating close together, and coupling is not desired, each of the structures can be rotated 90°, thereby establishing the axes of the tapered members in a single plane, and providing the minimum of electromagnetic coupling.

In practical application it was found that a tuned circuit such as represented by one of the resonant structures of Figure 8, comprising two tapered members of 2.5 mil copper foil mounted with a low loss cement on paper base Bakelite tubing with an inside diameter of 0.251 inch and a 10 mil wall thickness, provided a tunable range of 500 to 700 megacycles with a copper core movement of approximately 1⅜ inches as represented by the graph of Figure 10. The core in this case is approximately 1.25 inches long and of a diameter to fit the tubing with a loose sliding fit.

There has thus been described a resonant structure effectively operable in the ultra high frequency portion of the spectrum with a high degree of efficiency and stability and having a minimum of invariable circuit constants. This structure provides a relatively wide range of tuning, and tracking and linearity are easily attainable. Furthermore, the tuning structure may be provided at low cost and occupies a minimum of space in a receiver, for example, and in addition, circuit connections are kept to a minimum length since the tapered ends of the conductors may be connected directly to tube and other terminals.

What is claimed is:

1. A variable tuning device for ultra high frequency signal circuits, comprising in combination, a tubular supporting member of insulating material, a pair of thin tapered conductive elements insulated from each other throughout their length and mounted substantially on diametrically opposite sides and exteriorly of said supporting member, and a conductive core element slidably mounted within said supporting member and movable with respect to said elements from end to end, whereby the resonant frequency of said device can be adjusted within a predetermined frequency range.

2. In an ultra high frequency tuning system, a variable tuning device adapted for gang tuning operation, comprising in combination, an elongated tubular supporting member of isulating material, a pair of thin tapered conductive elements insulated from each other throughout their length and mounted in fixed spaced relation on diametrically opposite sides and exteriorly of said supporting member along the length thereof, a conductive core element of relatively short length slidably mounted within said supporting member to move in close proximity to and between said conductive elements from end to end thereof, circuit terminal connections for said conductive elements adjacent the taper ends thereof, and means for moving said member in unison with other tuning means for said system whereby the resonant frequency of said device and of the system may be adjusted within a predetermined frequency range.

3. In an ultra high frequency tuning system, a variable tuning device as defined in claim 2, wherein the conductive core element has a length equal to less than one-half the length of the tapered elements.

4. A variable tuning device for use in ultra high frequency signal circuits comprising in combination, a tubular supporting member of insulating material, a pair of tapered conductive strips insulated from each other throughout their length and mounted in fixed spaced and substantially parallel relation and exteriorly of said supporting member, and a conductive core element having a length equal to less than one-half the length of the tapered elements mounted within said tubular supporting member and movable therein from end to end of said elements, whereby the resonant frequency of said device may be adjusted within a predetermined frequency range.

References Cited in the file of this patent

UNITED STATES PATENTS

| | | |
|---|---|---|
| 2,132,208 | Dunmore | Oct. 4, 1938 |
| 2,246,928 | Schick | June 24, 1941 |
| 2,370,423 | Roberts | Feb. 27, 1945 |
| 2,410,656 | Herold | Nov. 5, 1946 |
| 2,411,858 | Harvey | Dec. 3, 1946 |
| 2,435,442 | Gurewitsch | Feb. 3, 1948 |
| 2,475,637 | Vladimir | July 12, 1949 |
| 2,478,120 | Montcalm | Aug. 2, 1949 |
| 2,512,945 | Kallmann | June 27, 1950 |
| 2,513,393 | Frey et al. | July 4, 1950 |
| 2,578,429 | Karplus | Dec. 11, 1951 |
| 2,627,579 | Wasmansdorff | Feb. 3, 1953 |